(12) United States Patent
Betsuyaku et al.

(10) Patent No.: US 12,716,145 B2
(45) Date of Patent: Aug. 25, 2026

(54) SILICON CARBIDE SINGLE CRYSTAL INGOT, SILICON CARBIDE WAFER, AND METHOD FOR MANUFACTURING SILICON CARBIDE SINGLE CRYSTAL

(71) Applicants: CENTRAL RESEARCH INSTITUTE OF ELECTRIC POWER INDUSTRY, Tokyo (JP); MIRISE Technologies Corporation, Nisshin (JP); DENSO CORPORATION, Kariya (JP); TOYOTA JIDOSHA KABUSHIKI KAISHA, Toyota (JP)

(72) Inventors: Kiyoshi Betsuyaku, Tokyo (JP); Norihiro Hoshino, Tokyo (JP); Isaho Kamata, Tokyo (JP); Hidekazu Tsuchida, Tokyo (JP); Takeshi Okamoto, Nisshin (JP); Takahiro Kanda, Nisshin (JP)

(73) Assignees: CENTRAL RESEARCH INSTITUTE OF ELECTRIC POWER INDUSTRY, Tokyo (JP); MIRISE Technologies Corporation, Nisshin (JP); DENSO CORPORATION, Kariya-city (JP); TOYOTA JIDOSHA KABUSHIKI KAISHA, Toyota (JP)

( * ) Notice: Subject to any disclaimer, the term of this patent is extended or adjusted under 35 U.S.C. 154(b) by 278 days.

(21) Appl. No.: 18/468,030

(22) Filed: Sep. 15, 2023

(65) Prior Publication Data

US 2024/0110308 A1 Apr. 4, 2024

(30) Foreign Application Priority Data

Oct. 3, 2022 (JP) ................................ 2022-159843

(51) Int. Cl.
*C30B 25/16* (2006.01)
*C30B 29/36* (2006.01)

(52) U.S. Cl.
CPC .............. *C30B 25/16* (2013.01); *C30B 29/36* (2013.01)

(58) Field of Classification Search
CPC ................................ C30B 25/16; C30B 29/36
See application file for complete search history.

(56) References Cited

U.S. PATENT DOCUMENTS 9,580,837 B2 * 2/2017 Zwieback ............... C30B 29/36
2012/0103249 A1 * 5/2012 Gupta ..................... C30B 29/36 117/89

(Continued)

FOREIGN PATENT DOCUMENTS

JP 2013-216514 A 10/2013
JP 2019-099438 A 6/2019

OTHER PUBLICATIONS

Office Action dated Jun. 4, 2025 issued in the corresponding Japanese Patent Application No. 2022-159843 (and English translation).

*Primary Examiner* — Nicholas J Tobergte
(74) *Attorney, Agent, or Firm* — Posz Law Group, PLC

(57) ABSTRACT

Provided are a method for manufacturing a silicon carbide single crystal, which can suppress conversion of threading edge dislocations into prismatic plane dislocations and conversion of the prismatic plane dislocations into basal plane dislocations; and a silicon carbide single crystal ingot and a silicon carbide wafer, in which conversion from threading edge dislocations into prismatic plane dislocations and conversion from the prismatic plane dislocations into basal plane dislocations have been suppressed. A silicon carbide single crystal is grown on the surface of a seed substrate by a gas method so that a temperature gradient in the radial (Continued)

direction of the seed substrate takes a predetermined value or lower during the growth. The area of regions T1 to T4, where regions R1 to R3 of a basal plane whose shear stresses exceed critical resolved shear stress, and regions S1 to S4 of a prismatic plane whose shear stresses exceed critical resolved shear stress overlap, is less than a half of the area of a crystal growth surface. Furthermore, the area of the regions T1 to T4 is smaller than the area of regions V1 to V4 where a region R4 of the basal plane whose shear stress does not exceed the critical resolved shear stress overlaps the regions S1 to S4.

4 Claims, 4 Drawing Sheets

(56) References Cited

U.S. PATENT DOCUMENTS

2021/0108334 A1* 4/2021 Kamata .................. C30B 29/36
2023/0279580 A1* 9/2023 Horiai .................... C30B 25/14
428/698

* cited by examiner

SHEAR STRESS ACTING ON BASAL PLANE

SHEAR STRESS ACTING ON PRISMATIC PLANE

SILICON CARBIDE SINGLE CRYSTAL INGOT, SILICON CARBIDE WAFER, AND METHOD FOR MANUFACTURING SILICON CARBIDE SINGLE CRYSTAL

The entire disclosure of Japanese Patent Application No. 2022-159843 filed on Oct. 3, 2022 is expressly incorporated by reference herein.

TECHNICAL FIELD

This invention relates to a silicon carbide single crystal ingot, a silicon carbide wafer, and a method for manufacturing a silicon carbide single crystal.

BACKGROUND ART

Silicon carbide (may hereinafter be referred to as SiC) is a semiconductor exhibiting excellent physical property values—a bandgap about 3 times as wide as, a saturation drift velocity about 2 times as high as, and a dielectric breakdown field strength about 10 times as high as, those of Si—and having a great thermal conductivity. Thus, it is expected as a material which realizes a next generation high voltage, low loss semiconductor device delivering performance markedly surpassing the performance of the Si single crystal semiconductor currently in use.

As a method for manufacturing an ingot composed of an SiC single crystal, high temperature chemical vapor deposition (hereinafter called HTCVD or the HTCVD method) is known (see, for example, Patent Document 1). With the HTCVD method, many of basal plane dislocations (may hereinafter be referred to as BPDs) contained in a seed substrate are converted into threading edge dislocations (may hereinafter be referred to as TEDs) by epitaxial growth.

However, some of the TEDs converted from the BPDs are not retained, but converted into prismatic plane dislocations, and the prismatic plane dislocations are further converted into BPDs.

PRIOR ART LITERATURES

Patent Documents

Patent Document 1: JP-A-2019-099438

SUMMARY OF INVENTION

Problems to be Solved by the Invention

The present invention has been accomplished in the light of the above-described circumstances. It is an object of this invention to provide a method for manufacturing a silicon carbide single crystal which can suppress the conversion of threading edge dislocations into prismatic plane dislocations and the conversion of the prismatic plane dislocations into basal plane dislocations; and to provide a silicon carbide single crystal ingot and a silicon carbide wafer in which conversion from threading edge dislocations into prismatic plane dislocations and conversion from prismatic plane dislocations into basal plane dislocations have been suppressed.

Means for Solving the Problems

A first aspect of the present invention for attaining the above object is a method for manufacturing a silicon carbide single crystal, which grows a silicon carbide single crystal on a surface of a seed substrate by HTCVD, the method comprising growing the silicon carbide single crystal so that a temperature gradient in a radial direction is a predetermined value or lower.

A second aspect of the present invention is the method for manufacturing a silicon carbide single crystal according to the first aspect, wherein the predetermined value is 15° C./mm.

A third aspect of the present invention is a silicon carbide single crystal ingot having a silicon carbide single crystal layer formed on a seed substrate, wherein regions of a basal plane of the silicon carbide single crystal layer, whose shear stresses exceed critical resolved shear stress (may hereinafter be referred to as CRSS), are treated as a first region, regions of a prismatic plane of the silicon carbide single crystal layer, whose shear stresses exceed critical resolved shear stress, are treated as a second region, regions where the first region and the second region overlap, relative to threading edge dislocations, are treated as a first overlap region, and in a plan view of a crystal growth surface of the silicon carbide single crystal layer, the area of the first overlap region is less than a half of the area of the crystal growth surface.

A fourth aspect of the present invention is the silicon carbide single crystal ingot according to the third aspect, wherein a region of the basal plane of the silicon carbide single crystal layer, whose shear stress does not exceed critical resolved shear stress, is treated as a third region, regions where the second region and the third region overlap are treated as a second overlap region, and the area of the first overlap region is smaller than the area of the second overlap region.

A fifth aspect of the present invention is a silicon carbide wafer sliced off the silicon carbide single crystal ingot according to the third or fourth aspect.

Effects of the Invention

According to the present invention, there are provided a method for manufacturing a silicon carbide single crystal which can suppress the conversion of threading edge dislocations into prismatic plane dislocations and the conversion of the prismatic plane dislocations into basal plane dislocations; and a silicon carbide single crystal ingot and a silicon carbide single crystal wafer in which conversion from threading edge dislocations into prismatic plane dislocations and conversion from the prismatic plane dislocations into basal plane dislocations have been suppressed.

MODE FOR CARRYING OUT INVENTION

Herein, an individual plane orientation is represented by (hkil), while a generic plane orientation including (hkil) and a plane orientation equivalent crystallogeometrically thereto is represented by {hkil}. In connection with a negative index, it is general crystallogeometrically to represent it by attaching "–" (bar) over a numeral denoting the index. Herein, however, the negative index is represented by attaching a negative sign (–) before a numeral denoting the index.

Figure 1A:
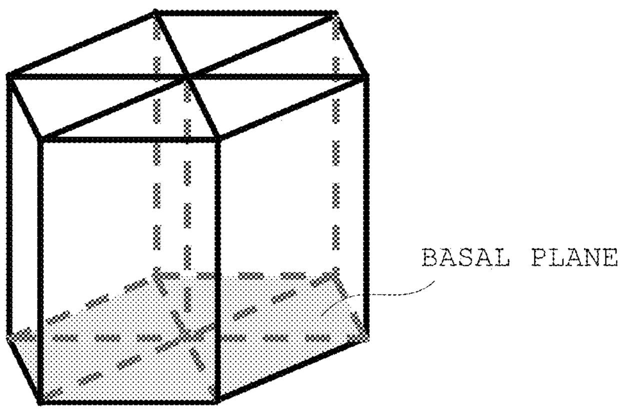
FIGS. 1A to 1C are schematic views showing a silicon carbide single crystal layer formed by epitaxial growth.
Figure 1B:
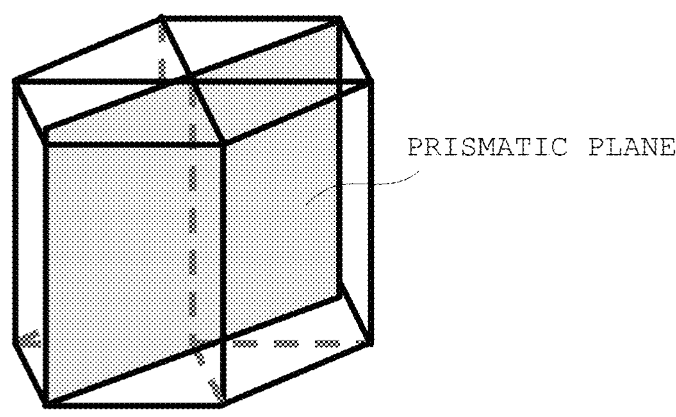
Figure 1C:
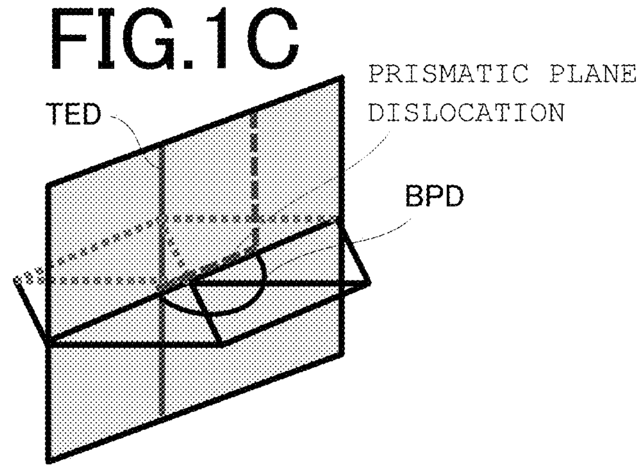
Figure 2A:
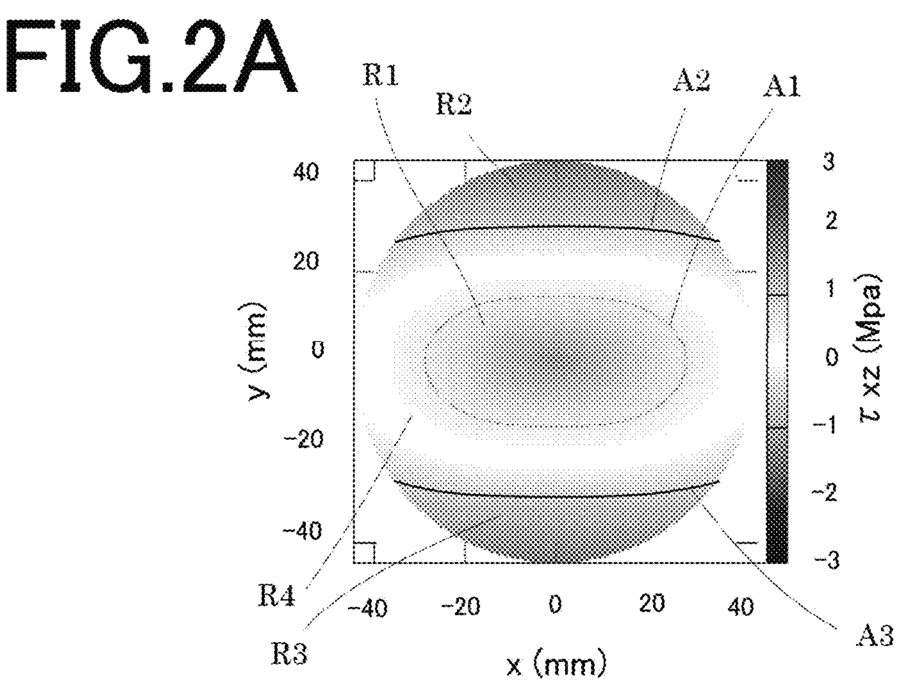
FIGS. 2A and 2B are views showing shear stresses acting on a basal plane and a prismatic plane of the silicon carbide single crystal layer.
Figure 2B:
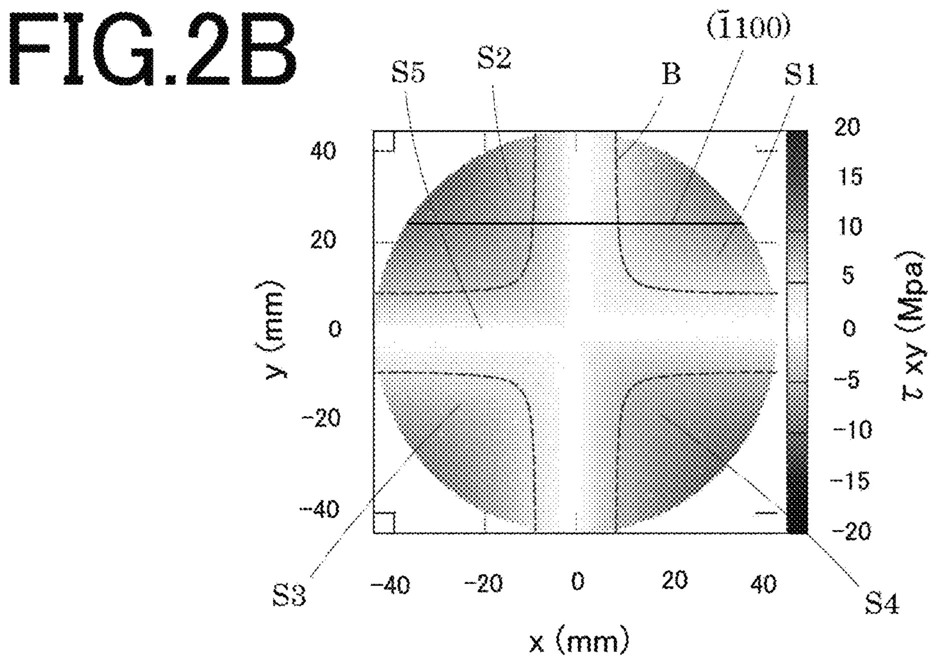

FIGS. 1A to 1C and FIGS. 2A, 2B are used to explain the mechanisms for the conversion of TEDs into prismatic plane dislocations and the conversion of the prismatic plane dislocations into BPDs during epitaxial growth. FIGS. 1A to 1C are schematic views showing a silicon carbide single crystal layer formed on a seed substrate by epitaxial growth. FIGS. 2A and 2B are views showing shear stresses acting on the basal plane and prismatic plane of the silicon carbide single crystal layer. FIG. 1A shows the basal plane, and FIG. 1B shows the prismatic plane. The basal plane is a {0001} plane, which is a (0001) Si plane or a (000-1) C plane. The prismatic plane is a plane vertical to the basal plane.

FIG. 2A shows the shear stress acting on the basal plane, while 2B shows the shear stress acting on the prismatic plane. Both drawings are plan views of the basal plane, in which the ordinate and the abscissa represent a length in an X-direction and a length in a Y-direction in the basal plane. The X-direction is [11-20]. The shear stress (unit: MPa) is expressed in shades, and the larger its absolute value, the darker the shade is.

FIG. 2A illustrates an ellipse A1, an arc A2, and an arc A3 as lines showing critical resolved shear stress acting on the basal plane. The ellipse A1 is elongated in the X-direction, and is located in the center of the basal plane. The arc A2 is located apart from the ellipse A1 in the +Y-direction. The arc A3 is located apart from the ellipse A1 in the –Y-direction. A region inside the ellipse A1 is R1. A region outside the arc A2 is R2, and a region outside the arc A3 is R3. A region outside the ellipse A1 and inside the arcs A2 and A3 is R4.

The region R1 is indicated in a dark shade, and undergoes a high shear stress exceeding the CRSS. The regions R2 and R3 are also indicated in dark shades, and undergo shear stresses heading in directions opposite to the direction of the shear stress in the region R1 and exceeding the CRSS. The region R4 is indicated in a light shade, and is subject to a shear stress lower than the CRSS. The regions R1, R2, and R3, where the shear stresses higher than the CRSS act, are collectively called "a high shear stress region in the basal plane". The first region as recited in the claims of the present application corresponds to "the high shear stress region in the basal plane".

FIG. 2B illustrates four curves B as lines showing CRSS acting on the prismatic plane. Regions outside the four curves B are a region S1, a region S2, a region S3, and a region S4, respectively. The regions S1 to S4 are each nearly fan-shaped. On the other hand, a region inside the four curves B is nearly cross-shaped, and designated as a region S5.

The regions S1 to S4 are indicated in dark shades, representing high shear stresses exceeding the CRSS. The shear stresses in the region S2 and the region S4 are in directions opposite to the directions of the shear stresses in the region Si and the region S3. The region S5 is indicated in a light shade, representing a lower shear stress than the CRSS. The regions S1 to S4, where the shear stresses higher than the CRSS act, are collectively called "a high shear stress region in the prismatic plane". A (–1100) plane, a prismatic plane, has opposite end portions shown in FIG. 2B and passing through the region S1 and the region S2. Hence, the regions S1 and S2 of the prismatic plane are subject to the shear stresses exceeding the CRSS. The second region as recited in the claims of the present application corresponds to "the high shear stress region in the prismatic plane".

The distributions of the shear stresses shown in FIGS. 2A, 2B are the results of stress analysis by the finite element method. As the CRSS, a value used generally for SiC is adopted. The distributions of the shear stresses in FIGS. 2A, 2B can be obtained from X-ray topographic images.

Figure 3:
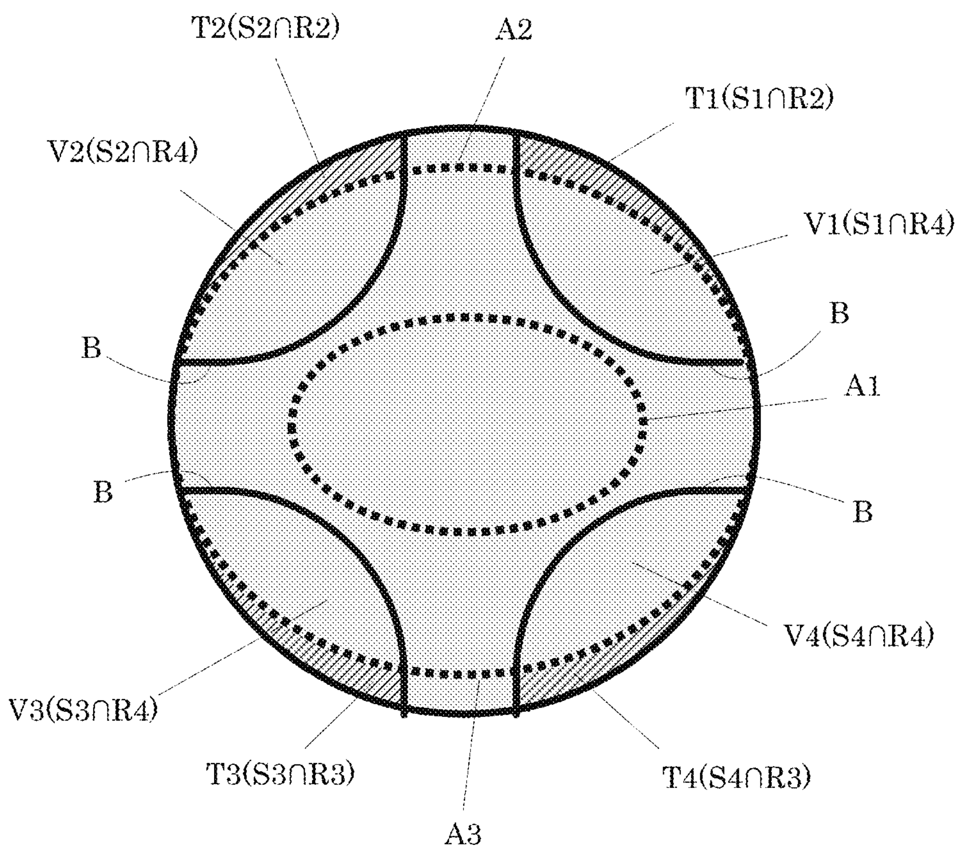
FIG. 3 is a view of high shear stress regions overlapping.

FIG. 3 reveals overlaps of the high shear stress regions shown in FIGS. 2A, 2B. The regions where the high shear stress region in the basal plane and the high shear stress region in the prismatic plane overlap are designated as a region T1 (S1∩R2), a region T2 (S2∩R2), a region T3 (S3∩R3), and a region T4 (S4∩R3), respectively. The first overlap region as recited in the claims of the present application corresponds to the regions T1 to T4.

In the regions T1 to T4, as shown in FIG. 1C, the shear stresses higher than the CRSS in the high shear stress region of the prismatic plane act on TEDs to convert them into prismatic plane dislocations. In the drawing, a single TED is illustrated. If a plurality of TEDs are present, however, some of them turn into prismatic plane dislocations. In the high shear stress region of the basal plane, moreover, the prismatic plane dislocations arising from the TEDs cross-slip, whereby they are converted into BPDs.

In the regions T1 to T4 where the high shear stress regions overlap, as noted above, TEDs are apt to be converted into prismatic plane dislocations, and the prismatic plane dislocations are apt to be converted into BPDs. It is preferred, therefore, to make the regions T1 to T4 as small as possible. For example, the total area of the regions T1 to T4 is rendered less than a half of the area of a crystal growth surface (the area of a circle in FIG. 3). Besides, it is preferred that each of the regions T1 to T4 be made smaller than each of regions V1 to V4. The region V1 is S1∩R4. That is, the region V1 is a region where the high shear stress region of the prismatic plane and the low shear stress region of the basal plane not exceeding the CRSS overlaps. Similarly, the region V2 is S2∩R4, the region V3 is S3∩R4, and the region V4 is S4∩R4. The third region as recited in the claims of the present application corresponds to the region R4. The second overlap region as recited in the claims of the present application corresponds to the regions V1 to V4.

Figure 4:
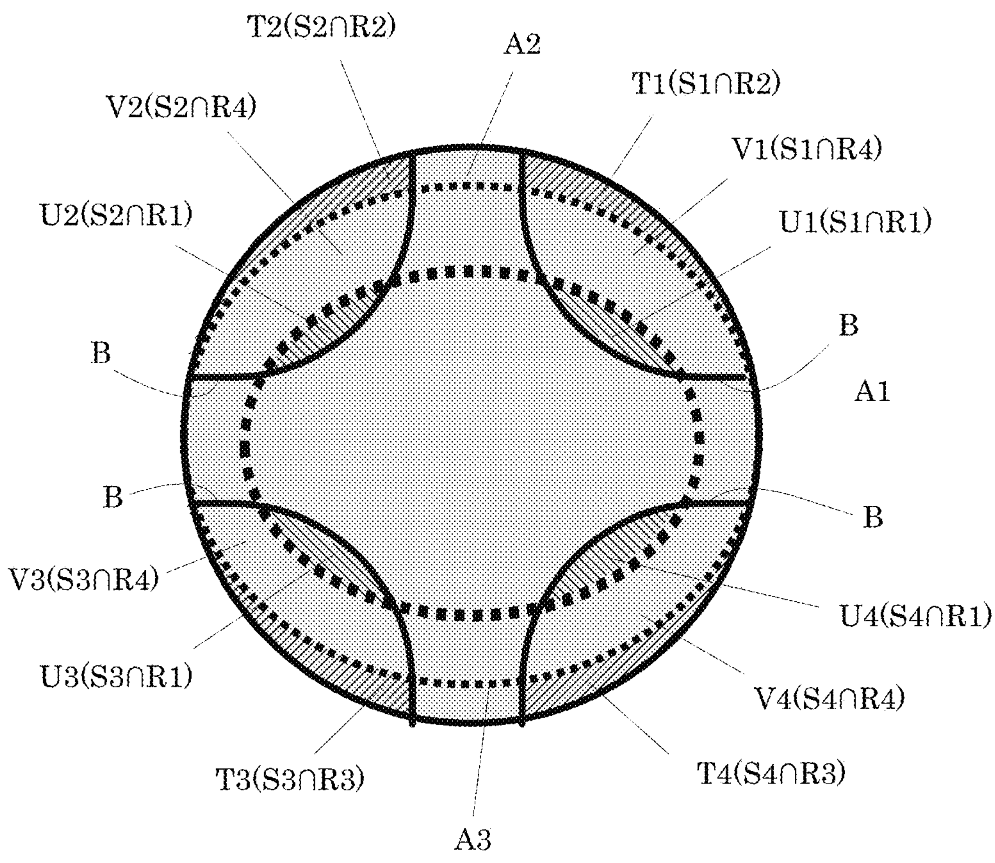
FIG. 4 is a view of high shear stress regions overlapping.

FIG. 4 reveals overlaps of the high shear stress regions, illustrating the manner of overlapping which is different from that in FIG. 3. A region U1 is S1∩R1. That is, the region U1 is a region where the high shear stress region of the prismatic plane and the high shear stress region of the basal plane overlap. Similarly, a region U2 is S2∩R1, a region U3 is S3∩R1, and a region U4 is S4∩R1. Since the regions U1 to U4 are regions where the high shear stress regions overlap, these regions should preferably be made as small as possible. For example, the total area of the regions T1 to T4 is rendered less than a quarter of the area of the crystal growth surface. Besides, it is preferred that each of the regions U1 to U4 be made smaller than each of the regions V1 to V4.

A method for manufacturing an SiC single crystal ingot having overlapping high shear stress regions as described above will be explained below. Although not illustrated, the SiC single crystal ingot is obtained by growing an SiC single crystal layer on one surface (will hereinafter be called a crystal growth surface) of a seed substrate by the HTCVD method.

The seed substrate has an off-angle. The off-angle refers to an angle between one surface (crystal growth surface), where a crystal of the seed substrate is grown, and the {0001} plane. The {0001} plane is the (0001) Si plane or the (000-1) C plane. The direction of the off-angle of the seed substrate is [1-100]. Such a seed substrate having an off-angle in the [1-100] direction with respect to the {0001} plane can be obtained, for example, by cutting out an existing SiC single crystal ingot diagonally. The off-angle is, say, 1° or more, but 8° or less, although not restricted. The polytype of the seed substrate is 4H—SiC.

An SiC single crystal layer is formed on the seed substrate by the HTCVD method. The method for manufacturing the SC single crystal layer by the HTCVD method is itself publicly known, and thus a detailed explanation for it is omitted. However, the manufacture is performed, for example, under the following conditions:

In the HTCVD method, the growth temperature is preferably 2450° C. or higher. It is preferred that the average growth rate until the SiC single crystal layer is grown to a thickness of 1 mm be rendered 1 mm/h or more. The pressure inside a container accommodating the seed substrate (will hereinafter be referred to as container-inside pressure) is set at 50 kPa or above, but 100 kPa or below. The ratio of the amount of an Si-based gas and the amount of a C-based gas supplied (i.e., C/Si ratio) is set at 1.0±0.15.

As a concrete method for forming the high shear stress regions as shown in FIG. 3, crystal growth is performed, with the temperature gradient in the radial direction of the silicon carbide single crystal layer being adjusted to a predetermined value or less, for example, 15° C./mm or less. By so adjusting the temperature gradient to the predetermined temperature or lower, the high shear stress regions of the basal plane and the prismatic plane are each decreased in area, and their overlapping region is also decreased in area.

Generally, the silicon carbide single crystal layer has a height difference arising in the thickness direction of the seed substrate, and this height difference produces the temperature gradient in the radial direction. For example, a temperature gradient of the order of 10 to 15° C./mm is produced in the longitudinal direction. In order to keep the temperature gradient down to the predetermined temperature or lower, therefore, the crystal is grown so that the thickness of the silicon carbide single crystal layer during crystal growth becomes uniform. Concretely, the arrangement, diameters, etc. of the flow paths for the source gases of the silicon carbide single crystal layer are adjusted so that the flow velocity distributions of the source gases become uniform. Moreover, the temperature of a heater for adjusting the temperature inside the container, where the seed substrate is disposed, is controlled.

The thickness of the silicon carbide single crystal layer during crystal growth tends to be, for example, such that a central portion of the layer is thick, while an outer edge portion of the layer is thin. It is preferred, however, that crystal growth be performed so that the height difference between the central portion and the outer edge portion is 1 mm.

An SiC single crystal ingot prepared by the manufacturing method described as above has a small region where the high shear stress regions in the basal plane and the prismatic plane overlap. In this ingot, therefore, the conversion of TEDs present in the SiC single crystal layer into prismatic plane dislocations is suppressed, and the conversion of the prismatic plane dislocations into BPDs is suppressed. Since the conversion of TEDs into prismatic plane dislocations or BPDs is suppressed as mentioned above, the SiC single crystal ingot is suitable for the manufacture of a semiconductor device.

In a wafer with a diameter of 3 inches, an analysis was conducted, with the temperature gradient from the center to the outermost periphery being set at 15° C./mm, the CRSS of the basal plane dislocations being 1 MPa, and the CRSS of the threading edge dislocations being 8 MPa. Upon the analysis, the total area of the regions T1 to T4 was provisionally calculated at less than a quarter of the area of the crystal growth surface.

According to the method for manufacturing an SiC single crystal ingot, as described above, an SiC single crystal ingot capable of preparing a good quality wafer can be manufactured, and the SiC single crystal ingot can be manufactured at a high growth rate by the HTCVD method.

EXPLANATIONS OF LETTERS OR NUMERALS

R1 to R3: First region
R4: Third region
S1 to S4: Second region
T1 to T4: First overlap region
V1 to V4: Second overlap region

What is claimed is:

1. A method for manufacturing a silicon carbide single crystal, which grows a silicon carbide single crystal on a surface of a seed substrate by HTCVD, comprising:
growing the silicon carbide single crystal,
wherein
a growth temperature in the HTCVD method is 2450° C. or higher, and
during crystal growth, a temperature gradient of 10 to 15° C./mm is produced in a longitudinal direction of the silicon carbide single crystal at any position in a radial direction.

2. A silicon carbide single crystal ingot having a silicon carbide single crystal layer formed on a seed substrate, wherein
regions of a basal plane of the silicon carbide single crystal layer, whose shear stresses exceed critical resolved shear stress, are treated as a first region,
regions of a prismatic plane of the silicon carbide single crystal layer, whose shear stresses exceed critical resolved shear stress, are treated as a second region,
regions where the first region and the second region overlap, relative to threading edge dislocations, are treated as a first overlap region, and
in a plan view of a crystal growth surface of the silicon carbide single crystal layer, an area of the first overlap region is less than a half of an area of the crystal growth surface.

3. The silicon carbide single crystal ingot according to claim 2, wherein
a region of the basal plane of the silicon carbide single crystal layer, whose shear stress does not exceed the critical resolved shear stress, is treated as a third region,
regions where the second region and the third region overlap are treated as a second overlap region, and
the area of the first overlap region is smaller than an area of the second overlap region.

4. A silicon carbide wafer sliced off the silicon carbide single crystal ingot according to claim 2.

* * * * *